United States Patent [19]

Allgood

[11] 4,260,959
[45] Apr. 7, 1981

[54] FET RELAXATION OSCILLATOR WITH REDUCED SENSITIVITY TO SUPPLY VOLTAGE AND THRESHOLD VARIATIONS

[75] Inventor: Robert N. Allgood, Austin, Tex.

[73] Assignee: Motorola, Inc., Schaumburg, Ill.

[21] Appl. No.: 58,218

[22] Filed: Jul. 16, 1979

[51] Int. Cl.³ .......................................... H03K 3/023
[52] U.S. Cl. .................................... 331/111; 331/175
[58] Field of Search ............... 331/111, 108 C, 108 D, 331/113 R, 175

[56] References Cited

U.S. PATENT DOCUMENTS

| 3,742,384 | 6/1973 | Breitzmann et al. | 331/111 |
| 3,904,988 | 9/1975 | Hsiao | 331/111 |

Primary Examiner—Siegfried H. Grimm
Attorney, Agent, or Firm—Joe E. Barbee

[57] ABSTRACT

An MOS oscillator is provided which has reduced sensitivity to power supply voltage variations and to threshold processing variations. A plurality of field effect transistors are connected in series to provide reference voltages to establish two trip points for a comparator. A second input of the comparator is connected to a capacitor whose charging and discharging is controlled by the output of the comparator. The plurality of series connected transistors form unsymmetrical active device dividers. The unsymmetrical configuration is chosen such that power supply variations and threshold variations cancel much of the charge current variation due to these variations. Matched current sources are used throughout the oscillator circuit.

14 Claims, 2 Drawing Figures

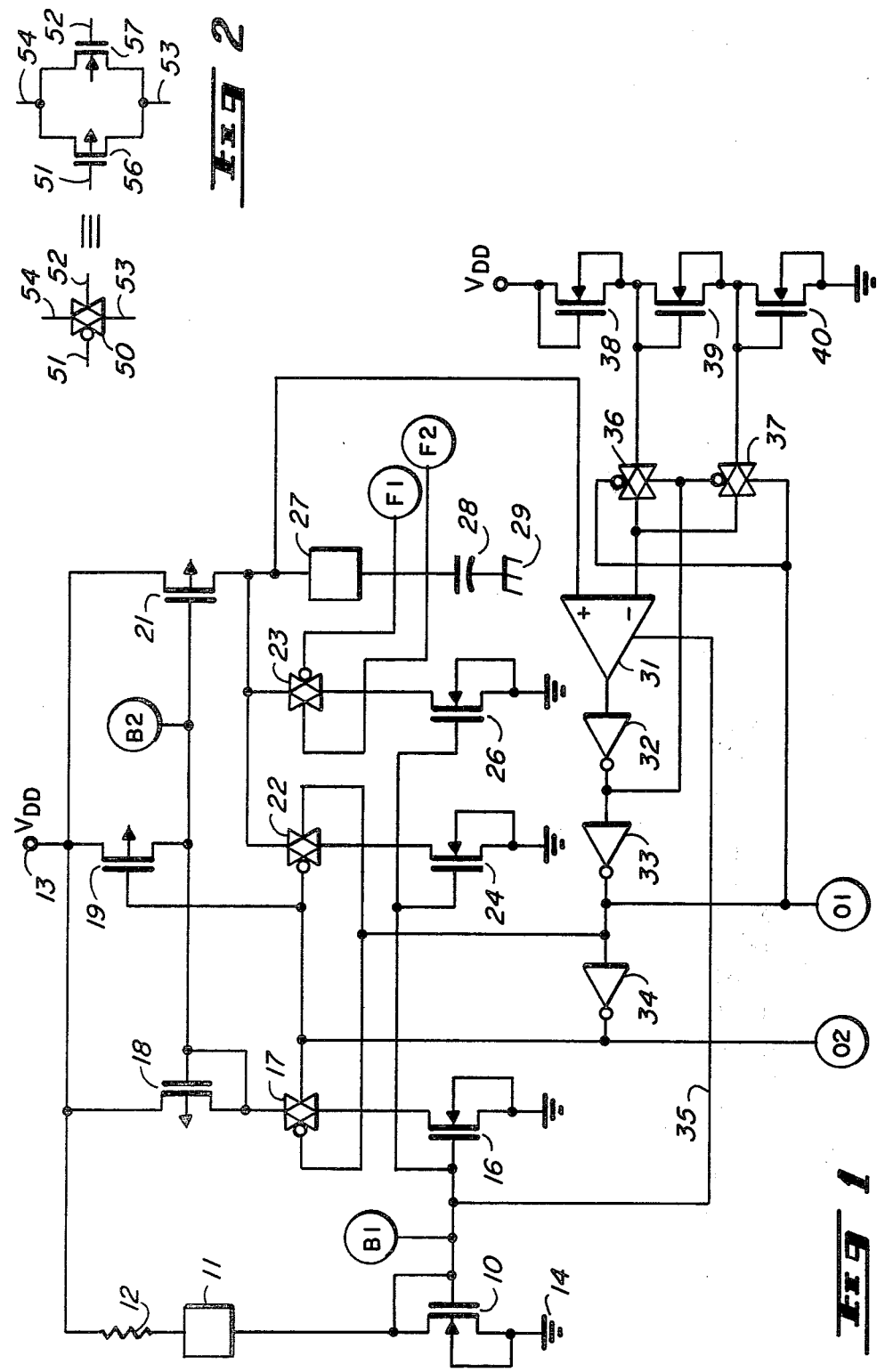

FET RELAXATION OSCILLATOR WITH REDUCED SENSITIVITY TO SUPPLY VOLTAGE AND THRESHOLD VARIATIONS

This invention relates, in general, to field effect transistor (FET) oscillators, and more particularly, to an oscillator having reduced sensitivity to $V_{DD}$ and threshold variations and useful in a smoke detector.

Oscillators using field effect transistors are used in many applications. Oscillators using complementary metal oxide semiconductor (CMOS) field effect transistors are particularly desirable for use in circuits where power consumption is a concern. Such circuits are, in general, those that are powered by batteries such as smoke detector circuits. However, a problem encountered in the past with CMOS oscillators which use a low amount of power is that such oscillators tend to produce a frequency which varies with variations in the supply voltage, $V_{DD}$, and with process variations which affect the transistor thresholds.

Accordingly, it is an object of the present invention to provide a FET oscillator with reduced sensitivity to $V_{DD}$ and threshold variations.

Another object of the present invention is to provide an oscillator which has a selectable frequency and duty cycle.

SUMMARY OF THE INVENTION

In carrying out the above and other objects of the present invention there is provided, in one form, an oscillator having field effect transistors and employing a comparator which senses the charging and discharging of a capacitor and has a reference input. The oscillator includes a voltage reference which is coupled to the reference input of the comparator. The voltage reference comprises a plurality of series connected transistors which provide reference voltages for the comparator which are substantially independent of power supply variations and of voltage threshold variations.

The subject matter which is regarded as the present invention is set forth in the appended claims. The invention itself, however, together with further objects and advantages hereof, may be better understood by referring to the following detailed description taken in conjunction with the accompanying drawings.

BRIEF DESCRIPTION OF THE DRAWINGS

FIG. 1 represents, partly in schematic and partly in block diagram form, one embodiment of the present invention; and FIG. 2 illustrates a preferred form of a controllable switch used in the circuitry of FIG. 1.

DETAILED DESCRIPTION OF THE DRAWINGS

The oscillator illustrated in FIG. 1 is a CMOS oscillator and has an N-channel transistor 10 connected in series with a resistor 12 between a first voltage terminal 13 and a second voltage terminal 14. Voltage terminal 13 is illustrated as being the power supply voltage $V_{DD}$ while voltage terminal 14 is illustrated as being a reference terminal such as ground. An interface pin 11 is shown between resistor 12 and transistor 10. Transistor 10 has its drain and gate connected to interface pin 11 and has its source connected to ground 14. Resistor 12 is a current setting resistor for the oscillator and along with transistor 10 provides an N-channel bias at node B1, which is without glitches, and can be used throughout the integrated circuit chip of which the oscillator of FIG. 1 can be a portion. If resistor 12 could be integrated as a precision high value resistor such as a thin film resistor, then interface pin 11 would not be required.

An N-channel transistor 16 has its source connected to ground and its gate electrode connected to the gate electrode of transistor 10. Transistor 16 along with transistor 10 form a current mirror which establishes the current flow through transistor 16. Transistor 16 has its drain connected to a transmission gate 17. Transmission gate 17 serves as a controllable switch which completes the current path between transistor 16 and a P-channel transistor 18. Transistor 18 has its gate and drain connected to transmission gate 17 and its source connected to voltage terminal 13. P-channel transistor 18 along with P-channel transistor 21 form a current mirror to establish a known charging current for capacitor 28. Transistor 21 has its gate connected to the gate of transistor 18 and its source connected to voltage terminal 13. The drain of transistor 21 is connected to a capacitor terminal or interface pin 27. Capacitor 28 is coupled between capacitor terminal 27 and a reference terminal 29. Since the oscillator of FIG. 1 is being described with reference to having particular application to a smoke detector ground 14 and ground 29 may be at slightly different potentials. This is particularly true if the smoke detector circuit has a resistor in series with one of the power supply terminals going to a battery which would power the circuit. In such a case ground 29 would be on the battery side of the resistor and ground 14 would be on the circuit side of the resistor. It should be noted that if the oscillator pulses in the millisecond or faster range, then capacitor 28 could become small enough to be integrated as part of the integrated chip containing the oscillator of FIG. 1. In such a case capacitor interface pin 27 would not be required.

A P-channel transistor 19 is coupled between voltage terminal 13 and the gate of transistor 21. A transmission gate 22 is coupled from capacitor terminal 27 to the drain of N-channel transistor 24. Transistor 24 has its source connected to ground 14 and has its gate connected to the gate of transistor 10. Transistor 24 provides a discharge path for capacitor 28 when transmission gate 22 is enabled. The gate electrode of transistor 24 is coupled to a known current source and therefore transistor 24 will allow capacitor 28 to discharge at a predetermined rate. Another transmission gate 23 is coupled from capacitor terminal 27 to the drain of an N-channel transistor 26. Transistor 26 has its gates coupled to the gate of transistor 10 and has its source connected to ground 14. Transmission gate 23 and transistor 26 are in parallel with transmission gate 22 and transistor 24. When transmission gate 23 is enabled at the same time transmission gate 22 is enabled then capacitor 28 can discharge through transistors 24 and 26. The two discharge paths allow capacitor 28 to discharge faster than through a single discharge path.

Interface pin or capacitor terminal 27 is coupled to an input of a comparator 31. Comparator 31 has a second input which is coupled to transmission gates 36 and 37. Three N-channel transistors 38, 39 and 40 are connected in series between voltage terminal 13 and voltage terminal 14. Each one of transistors 38, 39 and 40 has its gate connected to its drain and in combination they form a voltage reference. A first output is obtained from between transistors 38 and 39 and a second output is obtained from between transistors 39 and 40. The first output is coupled to transmission gate 36 and the second output is coupled to transmission gate 37. Transistors 38, 39 and 40 serve as a voltage reference source which supplies a first and a second reference and transmission gates 36 and 37 serve to couple either the first or the second reference voltage to the second input of comparator 31. Comparator 31 provides an output to the input of inverter 32, inverter 33 inverts the output of inverter 32 and inverter 34 inverts the output of inverter 33. Three inverters 32, 33, and 34 are coupled to the output of comparator 31 and help to improve the rise time of the output of comparator 31. Comparator 31, in a preferred embodiment, is a standard CMOS comparator, which does not, in general, provide a very fast rise time output. If the rise time from comparator 31 is not critical then of course one inverter would suffice to perform the necessary transmission gate controls. Comparator 31 has a bias input 35 which comes from the N-channel bias node B1 and is used as bias for the current source of comparator 31.

A digital clock output and its inverse signal, both of which are derived from the output of comparator 31 appear at nodes 01 and 02. These digital clock outputs are available for use in other portions of the circuitry which are located on the same integrated circuit chip as the oscillator. A strobed P-channel current source can be obtained from node B2. The strobed P-channel current source could be used in strobed operational amplifiers, comparators, etc., in order to conserve current. A sawtooth voltage waveform can also be obtained from across capacitor 28.

The operation of the circuit will now be explained. If it is assumed that transmission gate 36 is enabled, capacitor 28 is discharged and a positive voltage is being applied to the inverting input of comparator 31, the output of inverter 31 will be low. Inverter 32 inverts the low output from comparator 31 and therefore provides a high output at the output of inverter 32. Inverter 33 will provide a low output and inverter 34 will provide a high output. The output of inverters 32 and 33 will be of the proper level to enable transmission gate 36 and at the same time inhibit or not enable transmission gate 37. At the same time the outputs from inverters 33 and 34 will enable transmission gate 17 and disable transmission gate 22. Transmission gate 17 will complete a current path between transistors 16 and 18. The current flowing through transistor 18 will be mirrored over to transistor 21 thereby allowing transistor 21 to conduct which will cause capacitor 28 to charge. Note that the output from inverter 34 is at a high level and therefore transistor 19 will be in a non-conductive state since it is a P-channel transistor.

As capacitor 28 charges up it will cause the output of comparator 31 to switch from a low level to a high level and inverters 32 and 34 will invert the output of comparator 31. The output of comparators 32 and 33 will cause transmission gate 36 to be disabled and will enable transmission gate 37. Transmission gate 37 will now apply a lower trip point voltage from the three-FET voltage divider to the inverting input of comparator 31. This means that the voltage across capacitor 28 can decrease to a lower level before the output of comparator 31 will switch again. The outputs of inverters 33 and 34 have now changed level and will cause transmission gate 17 to be disabled and will enable transmission gate 22. With transmission gate 22 being enabled, a discharge path is now completed from capacitor 28 through discharging means or transistor 24 to ground 14. The output of inverter 34 which helps to disable transmission gate 17 and enable transmission gate 22 also causes pull-up transistor 19 to conduct thereby increasing the turnoff rate of transistor 21. As capacitor 28 is discharged to the new trip point voltage level supplied through transmission gate 37, the output of comparator 31 will switch again and the cycle will repeat itself. If it is desired to change the duty cycle and the frequency of the oscillator, proper control signals can be applied to nodes F1 and F2 to enable transmission gate 23 at the same time transmission gate 22 is enabled and capacitor 28 can discharge through transistor 26 as well as through transistor 24. This increases the discharge rate of capacitor 28 which results in a new duty cycle and a new frequency. It should be noted that transistors 18 and 21 can be ratioed to provide the desired charging current to capacitor 28, and transistors 24 and 26 can be ratioed to provide the desired discharge rate for capacitor 28.

The constant current charging and discharging of capacitor 28 produces a sawtooth waveform across capacitor 28. The charge and discharge times are determined separately by two applications of the following equation:

$$I = C \frac{dv}{dt}$$

$$\int I dt = \int C dv$$

$I \Delta T = C \Delta V$ since $I$ and $C$ are constants for a charge or discharge interval $$\Delta T = \frac{C \Delta V}{I}$$

where
I = the charge or discharge current,
C = the capacitance of capacitor 28, and
ΔT is the charge or discharge time.
ΔV is the difference between trip point voltages and is the drain-source voltage of transistor 39 in this configuration. Since the charge and discharge currents are internally set by device size ratios, a wide range of charge time to discharge time ratios may be obtained which results in an oscillator output or digital clock output having independently determined (and mask adjustable) high and low pulse widths. Digital selection of alternate current sources makes possible alteration of clock frequency and/or duty cycle under internal or external control. Finally, the clock frequency is adjustable with external resistor 12 or external capacitor 28.

In order to minimize the oscillator sensitivity to power supply voltage and threshold variations the three field effect transistors 38, 39 and 40, which provide the voltage trip points, are ratioed so that one of the three is of a different physical size. Since each transistor has its gate tied to its drain, transistors 38, 39 and 40 are saturated in an enhancement-mode process like CMOS. Also, the current flow through each transistor is equal if a very low input bias comparator such as a CMOS comparator is used. Since transistors 38, 39, and 40 are all made at the same time with the same process, their voltage thresholds are assumed to be equal. The physical size of any two transistors can be chosen to be equal and the voltages across each of the transistors can be determined by the following derivation. For this configuration the physical size of transistor 38 is chosen to be equal to the physical size of transistor 40 with the physical size of transistor 39 being different. The saturation current equations for the transistors then yields:

$$K_1 W_1/L_1 (V_{GS1} - V_{T1})^2 = K_2 W_2/L_2 (V_{GS2} - V_{T2})^2$$
$$= K_3 W_3/L_3 (V_{GS3} - V_{T3})^2$$

where:
 $K_1$, $K_2$, and $K_3$ equal the physical constants of transistors 38, 39, and 40 repectively;
 $W_1$, $W_2$, and $W_3$ equal transistor widths of transistors 38, 39, and 40 respectively;
 $L_1$, $L_2$, and $L_3$ equal transistor lengths of transistors 38, 39, and 40 respectively;
 $V_{GS1}$, $V_{GS2}$, and $V_{GS3}$ are the gate-source voltages of transistors 38, 39, and 40 respectively; and $V_{T1}$, $V_{T2}$, and
 $V_{T3}$ are the threshold voltages for transistors 38, 39, and 40 respectively.

When using closely matched transistors such as those available on an integrated circuit it is reasonable to assume:

$$K_1 = K_2 = K_3 \text{ and}$$
$$V_{T1} = V_{T2} = V_{T3} = V_T$$

Also each transistor has its gate connected to its drain, so that $V_{DS} = V_{GS}$. For simplicity in this derivation it will be assumed that $W_1 = W_2 = W_3$. Therefore, taking the square root of the saturation current equation and simplifying, $$\sqrt{\frac{1}{L_1}} (V_{DS1} - V_T) = \sqrt{\frac{1}{L_2}} (V_{DS2} - V_T) = \sqrt{\frac{1}{L_3}} (V_{DS3} - V_T)$$

But $V_{DS1} = V_{DS3} = .5 (V_{DD} - V_{DS2})$, so $$\sqrt{\frac{1}{L_1}} (.5(V_{DD} - V_{DS2}) - V_T) = \sqrt{\frac{1}{L_2}} (V_{DS2} - V_T)$$

$$\sqrt{\frac{1}{L_1}} (.5 V_{DD} - V_T) - .5 \sqrt{\frac{1}{L_1}} V_{DS2} = \sqrt{\frac{1}{L_2}} V_{DS2} - \sqrt{\frac{1}{L_2}} V_T$$

$$\frac{1}{L_1} (.5 V_{DD}) + V_T \left( \sqrt{\frac{1}{L_2}} - \sqrt{\frac{1}{L_1}} \right) = \left( \sqrt{\frac{1}{L_2}} + .5 \sqrt{\frac{1}{L_1}} \right) V_{DS2}$$

$$V_{DS2} = \frac{.5\sqrt{\frac{1}{L_1}}}{\sqrt{\frac{1}{L_2}} + .5\sqrt{\frac{1}{L_1}}} V_{DD} + \frac{\sqrt{\frac{1}{L_2}} - \sqrt{\frac{1}{L_1}}}{\sqrt{\frac{1}{L_2}} + .5\sqrt{\frac{1}{L_1}}} V_T$$

$$V_{DS2} = \frac{.5}{\sqrt{\frac{L_1}{L_2}} + .5} V_{DD} + \frac{\sqrt{\frac{L_1}{L_2}} - 1}{\sqrt{\frac{L_1}{L_2}} + .5} V_T$$

Previously it has been shown that the current source oscillator equation can be written $$\Delta T = \Delta V C / I$$

where $\Delta V$ is equal to $V_{DS2}$ of the preceeding derivation. For the biasing network shown in FIG. 1 the desired current ($I_{10}$) through transistor 10 will be very small to conserve power, so that the gate-source voltage of transistor 10 will be very close to the threshold voltage. Then the current through transistor 10 will be controlled by the voltage drop across resistor 12:

$$I_{10} = (V_{DD} - V_T)/R_{12}$$

The current through the charge and discharge transistors will be directly proportional to $I_{10}$ by a geometrical constant so that $$\Delta T \propto \frac{\Delta V}{(V_{DD} - V_T)}$$

since $R_{12}$ and C are constant.

Therefore $\Delta V$ must be proportional to $(V_{DD} - V_T)$ for the charge and discharge intervals $\Delta T$ to remain constant over supply voltage and processing variations. From the voltage divider equation we get $$\Delta T = Y_1 V_{DD} + Y_2 V_T$$

where $$Y_1 = \frac{.5}{\sqrt{\frac{L_1}{L_2}} + .5}$$

$$Y_2 = \frac{\sqrt{\frac{L_1}{L_2}} - 1}{\sqrt{\frac{L_1}{L_2}} + .5}$$

To get $\Delta V \propto V_{DD} - V_T$, then $Y_2 = -Y_1$. This condition is satisfied when $L_2$ is equal to four times $L_1$. Therefore it will be noted that with a three transistor voltage divider a length ratio of 1:4:1 would give a current source oscillator with the least sensitivity to power supply voltage and threshold voltage variations.

FIG. 2 illustrates in greater detail the transmission gates used in FIG. 1. A transmission gate 50 has a first control input 51 and a second control input 52 and has an input 53 and an output 54. The input and output of transmission gate 50 can be reversed since the transmission gate is bidirectional in that it can pass a signal in either direction. Transmission gate 50 has a P-channel transistor 56 and an N-channel transistor 57. Transistor 56 has its gate electrode connected to first control input 51 and transistor 57 has its gate electrode connected to second control input 52. Due to the manner in which the transmission gate is used in FIG. 1, the control inputs enable both transistors 56 and 57 at the same time.

By now it should be appreciated that there has been provided an oscillator which has good stability over processing variations and over power supply variations. The oscillator can operate with only a few microamps of average current since the device divider string, the comparator, and the current setting transistor 10 can function at under one microamp apiece. The oscillator, as illustrated, requires two external pins. One of the external pins is for a grounded capacitor and the other external pin is for a current setting resistor which is connected to the positive power supply. Advantage can be taken of the use of the current setting resistor to provide an N-channel bias line, without glitches, which can be used in other portions of the circuit on the same integrated circuit chip as the oscillator.

I claim:

1. A field effect transistor oscillator comprising: a comparator having a first input, a second input and an output; an inverter coupled to the output of the comparator and providing an inverted output; a current source for providing a current; a first transmission gate coupled to the current source to control current out of the current source, the transmission gate also being coupled to the output of the comparator to allow control of the transmission gate by the comparator output; a capacitor terminal coupled to the current source so that current out of the current source can reach the capacitor terminal, the capacitor terminal also being coupled to the first input of the comparator; a second transmission gate coupled to the capacitor terminal for controllably discharging any charge appearing at the capacitor terminal, the second transmission gate being controlled by the output from the comparator; and a voltage reference coupled to the second input of the comparator wherein the voltage reference includes a plurality of field effect transistors connected in series, each one of the plurality of field effect transistors being connected in a diode configuration, and one of the plurality of transistors being of a different physical size than others of the plurality of transistors.

2. The field effect transistor oscillator of claim 1 wherein the voltage reference provides a first and a second voltage; a third transmission gate coupled between the first voltage and the second input of the comparator; and a fourth transmission gate coupled between the second voltage and the second input of the comparator, the third and fourth transmission gates being controlled by the output from the comparator and from the inverter so that only one of the third and fourth transmission gates is enabled at any given time.

3. An oscillator having field effect transistors, comprising: a comparator having a first input, a second input and an output; a controllable current source; charge storing means coupled to the current source, the current source supplying current to the charge storing means under control of the output from the comparator, the charge storing means also being coupled to the first input of the comparator; discharge means controllably coupled to the charge storage means to discharge the charge storage means under control of the output from the comparator; and a voltage reference coupled to the second input of the comparator wherein the voltage reference includes three series connected field effect transistors and provides a first voltage from above a center field effect transistor and provides a second voltage from below the center field effect transistor, and one of the three series connected field effect transistors being larger in physical size than the other two series connected field effect transistors.

4. The oscillator of claim 3 wherein the voltage reference provides a first and a second output; a first controllable switch for coupling the first output to the second input of the comparator; and a second controllable switch for coupling the second output to the second input of the comparator, the first and second controllable switches being controlled by the output of the comparator.

5. The oscillator of claim 4 further including a first inverter coupled to the output of the comparator; a second inverter coupled to the first inverter; and a third inverter coupled to the second inverter, outputs of the first and second inverters controlling the first and second controllable switch means, and outputs of the second and third inverters controlling the current source.

6. The oscillator of claim 3 further including means to quickly stop current supply to the charge storing means.

7. The oscillator of claim 3 further including a resistance means having a precise value as part of the current source to precisely control the current source output.

8. An integrated circuit oscillator useful in a smoke detector and having field effect transistors, comprising: a current source reference for providing a reference to a current supply; a current supply coupled to the current source reference; a comparator having a first and a second input and an output; at least one inverter coupled to the output of the comparator; a capacitor coupled to the current supply and to the first input of the comparator; a first controllable switch coupled to the output of the comparator for enabling the current supply to provide a current to the capacitor; a discharge means coupled to the capacitor for discharging the capacitor; a second controllable switch coupled between the capacitor and the discharge means, the second controllable switch being controlled by the output from the comparator; a first, a second, and a third field effect transistor connected in series to provide a first and a second reference voltage; a third controllable switch coupled between the first reference voltage and the second input of the comparator, the third controllable switch being controlled by the output from the comparator; and a fourth controllable switch coupled between the second reference voltage and the second input of the comparator, the fourth controllable switch being controlled by the output from the comparator.

9. A CMOS oscillator having a first and a second voltage terminal, comprising: a resistor terminal; a first N-channel transistor coupled to the resistor terminal and having its gate electrode connected to its drain electrode; a second N-channel transistor having its gate electrode coupled to the gate electrode of the first N-channel transistor and having its source electrode coupled to the second voltage terminal; a first transmission gate coupled to the drain electrode of the second N-channel transistor, the transmission gate having a first and a second control input; a first P-channel transistor having its gate and drain coupled to the first transmission gate and having its source coupled to the first voltage terminal; a second P-channel transistor having a source, drain and gate, its gate being coupled to the gate of the first P-channel transistor, its source coupled to the first voltage terminal; a capacitor terminal, the drain of the second P-channel transistor being coupled to the capacitor terminal; a third N-channel transistor having a source coupled to the second voltage terminal, having a gate coupled to the gate of the first N-channel transistor, and having a drain; a second transmission gate coupled to the drain of the second P-channel transistor and coupled to the drain of the third N-channel transistor, the second transmission gate having a first and a second control input; a comparator having an output and a second input and having a first input coupled to the capacitor terminal; a fourth, a fifth and a sixth N-channel transistor all connected in series between the first and second voltage terminals and providing a first output reference from between the fourth and fifth N-channel transistors and providing a second output reference from between the fifth and sixth N-channel transistors; a third transmission gate having a first and a second control input and being coupled between the first output reference and the second input of the comparator; a fourth transmission gate having a first and a second control input and being coupled between the second output reference and the second input of the comparator; a first inverter coupled to the output of the comparator and having an output; a second inverter coupled to the output of the first inverter and providing an output; and a third inverter coupled to the output of the second inverter and providing an output, the output of the third inverter being coupled to the first control input of the second transmission gate and to the second control input of the first transmission gate, the output of the second inverter being coupled to the first control input of the first transmission gate and coupled to the second control input of the second transmission gate, and also being coupled to the first control input of the third transmission gate and to the second control input of the fourth transmission gate, and the output of the first inverter being coupled to the second control input of the third transmission gate and to the first control input of the fourth transmission gate.

10. The CMOS oscillator of claim 9 further including a resistor coupled to the resistor terminal, and a capacitor coupled to the capacitor terminal.

11. The CMOS oscillator of claim 9 wherein the fifth N-channel transistor is larger in physical size than the fourth and sixth N-channel transistors.

12. The CMOS oscillator of claim 9 further including a third P-channel transistor coupled between the first voltage terminal and the gate of the second P-channel transistor and having its gate coupled to the output of the third inverter.

13. The CMOS oscillator of claim 9 further including a seventh N-channel transistor having a drain and having a gate coupled to the gate of the first N-channel transistor and having a source coupled to the second voltage terminal, and a fifth transmission gate coupled between the capacitor terminal and the drain of the seventh N-channel transistor and having a first and a second control input available for application of a control signal.

14. A CMOS oscillator providing an output frequency which is substantially independent of voltage variations and having a comparator having a first and a second input, the first input being for coupling to a capacitor and the second input being for coupling to a voltage reference, and three series connected N-channel transistors providing a first and a second voltage, the first and second voltages being controllably coupled to the second input of the comparator, and one of the three transistors being larger in physical size than the other two transistors.

* * * * *